United States Patent [19]
Jeng

[11] Patent Number: 6,103,595
[45] Date of Patent: Aug. 15, 2000

[54] ASSISTED LOCAL OXIDATION OF SILICON

[75] Inventor: Nanseng Jeng, Boise, Id.

[73] Assignee: Micron Technology, Inc., Boise, Id.

[21] Appl. No.: 08/931,093

[22] Filed: Aug. 20, 1997

Related U.S. Application Data

[63] Continuation of application No. 08/514,159, Aug. 11, 1995, Pat. No. 5,661,073.

[51] Int. Cl.[7] .................................................. H01L 21/76
[52] U.S. Cl. ........................ 438/431; 438/437; 438/444; 438/702
[58] Field of Search ..................... 438/431, 437, 438/444, 702; 257/288; 427/620, 621, 622, 640, 635, 647, 649

[56] References Cited

U.S. PATENT DOCUMENTS

| | | | |
|---|---|---|---|
| 4,512,073 | 4/1985 | Hsu | 29/571 |
| 4,533,429 | 8/1985 | Josquin | 357/49 |
| 4,666,556 | 5/1987 | Fulton et al. | 357/49 |
| 4,685,198 | 8/1987 | Kawakita et al. | 357/49 |
| 5,077,234 | 12/1991 | Scoopo et al. | 437/67 |
| 5,416,348 | 5/1995 | Jeng | 257/297 |
| 5,438,016 | 8/1995 | Figura et al. | 437/67 |
| 5,455,194 | 10/1995 | Vaquez et al. | 437/67 |
| 5,472,904 | 12/1995 | Figura et al. | 437/67 |
| 5,492,853 | 2/1996 | Jeng et al. | 437/60 |
| 5,504,033 | 4/1996 | Bajor et al. | 437/72 |
| 5,538,916 | 7/1996 | Kuroi et al. | 437/72 |
| 5,629,230 | 5/1997 | Fazan et al. | 438/446 |

FOREIGN PATENT DOCUMENTS

| | | | |
|---|---|---|---|
| 01020480 | 6/1982 | Japan | 437/72 |
| 0168233 | 10/1983 | Japan | 437/67 |
| 0190040 | 11/1983 | Japan | 437/72 |
| 0050540 | 3/1984 | Japan | 437/67 |
| 0065446 | 4/1984 | Japan | 437/72 |
| 0232437 | 12/1984 | Japan | 437/72 |
| 0105247 | 6/1985 | Japan | 437/72 |
| 0133739 | 7/1985 | Japan | 437/72 |
| 0142535 | 7/1985 | Japan | 437/67 |
| 0145638 | 8/1985 | Japan | 437/72 |
| 0046543 | 2/1987 | Japan | 437/67 |
| 362040740 | 2/1987 | Japan | 437/67 |
| 0048049 | 3/1987 | Japan | 437/67 |
| 62-48049 | 3/1987 | Japan . | |
| 0020635 | 1/1989 | Japan | 437/67 |
| 1-20635 | 1/1989 | Japan . | |
| 0032646 | 2/1989 | Japan | 437/67 |
| 00504430 | 2/1990 | Japan | 437/72 |
| 000498717 | 8/1992 | Japan | 437/72 |

OTHER PUBLICATIONS

D. H. Ahn, S. J. Ahn, P.B. Griffin*, M. W. Hwang, W. S. Lee, S. T. Ahn, C.G. Hwange, and M. Y. Lee, "A Highly Modified LOCOS Isolation Technology for the 256 Mbit DRAM", IEDM, 1994, pp. 28.3.1–28.3.4.

*Primary Examiner*—Benjamin L. Utech
*Assistant Examiner*—Matthew Anderson

[57] ABSTRACT

A method for forming a semiconductor device comprises the steps of providing a semiconductor substrate having first and second surfaces, the second surface having an inferior plane with respect to the first surface. An oxidizing-resistant layer such as nitride is formed on the first surface, and an oxidizable material is formed over the first and second surfaces. A protective material is formed over the first and second surfaces, which is then removed from the first surface. Subsequent to the step of removing the protective material from the first surface, the oxidizable material is removed from the first surface and is left over the second surface. Subsequent to the step of removing the oxidizable material from the first surface, the protective material is removed from the second surface and the oxidizable material remains over the second surface. Subsequent to removing the protective material from the second surface, the oxidizable material on the second surface is oxidized. A field oxide formed by oxidizing the poly can be self-limiting and very uniform, thereby avoiding the commonly observed field oxide thinning effect in tight pitch areas.

20 Claims, 2 Drawing Sheets

ASSISTED LOCAL OXIDATION OF SILICON

This is a continuation of U.S. application Ser. No. 08/514,159 filed Aug. 11, 1995 and issued Aug. 26, 1997 as U.S. Pat. No. 5,661,073.

FIELD OF THE INVENTION

The invention relates to the field of semiconductor manufacture, and more specifically to the formation of an isolation region such as field oxide.

BACKGROUND OF THE INVENTION

Many types of semiconductor devices such as dynamic random access memories (DRAMs), static rams (SRAMs), and programmable memories are formed in much the same way. Layers of oxide, nitride, and polycrystalline silicon (polysilicon or poly) are formed over a substrate such as silicon to form field and gate oxide, capacitor cell plates, word and digit lines, and various other structures.

To form a thick oxide layer such as field oxide, a thin blanket oxide layer is formed over a substrate. A blanket layer of protective material such as nitride is formed over the oxide layer, and a patterned mask is formed over the protective layer to cover regions of protective material and leaving other regions of protective material exposed. The exposed protective regions (and often the underlying oxide layer) are etched to expose the underlying oxide layer (or underlying substrate). The substrate is then oxidized to form the field oxide.

Depending on the design of the device being formed, the field oxide can often require varying distances between an adjacent field oxide, for example to form active areas within the substrate. To form the field oxide, areas of material which resist oxide formation (such as nitride) are formed which have varying distances between the areas. The distance between the nitride areas can vary depending on the design of the device. For example, the distance between a first area and a second area can be less than a distance between the second area and a third area, depending on the active areas required for a particular design of the device. One problem which can result from differing distances between structures is field oxide thinning. When the substrate is oxidized, the smaller distance between first and second areas forms a thinner field oxide than the wider area between the second and third areas. This difference in field oxide thickness can result in a device that has less desirable electrical characteristics than a device in which the field oxide thickness is uniform across the device. A process for reducing field oxide thinning in the narrow regions would be desirable.

SUMMARY OF THE INVENTION

A method for forming a semiconductor device comprises the steps of forming a blanket layer of material over a substrate, forming a protective layer over a first portion of the material and leaving a second portion of the material exposed, and removing the exposed second portion of the material. Next, an insulator is formed from at least a portion of the first portion of the material.

Objects and advantages will become apparent to those skilled in the art from the following detailed description read in conjunction with the appended claims and the attached drawings.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 1:
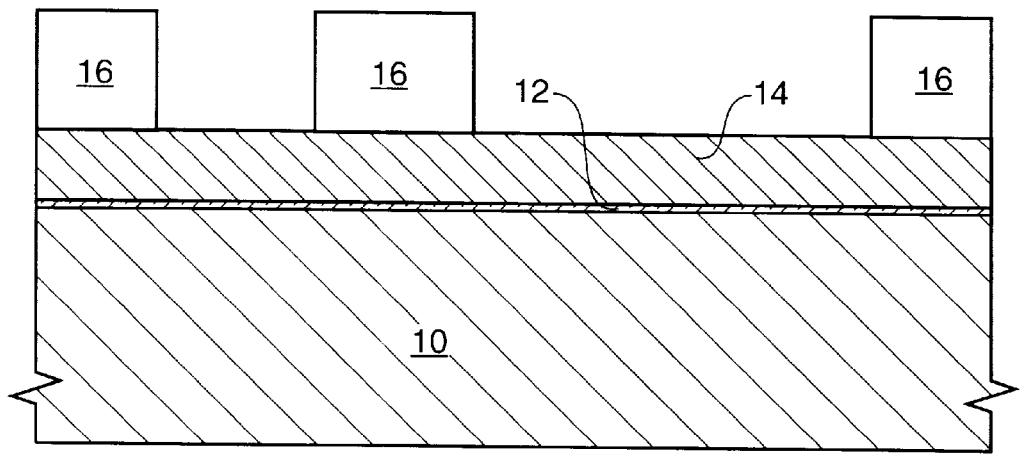
FIG. 1 is a cross section showing a starting structure.

FIG. 1 is a cross section showing a starting structure for practicing an embodiment of the inventive method. Particularly, a substrate 10 such as a wafer of silicon has formed thereon an oxide layer 12, and a blanket layer which resists the formation of an isolation material, for example nitride 14. The oxide layer 12 is not required for the practice of the invention, but may reduce damage to the silicon as the nitride is formed and during field oxidation. Materials other than oxide may function to reduce damage to the substrate during formation of layer 14.

Figure 2:
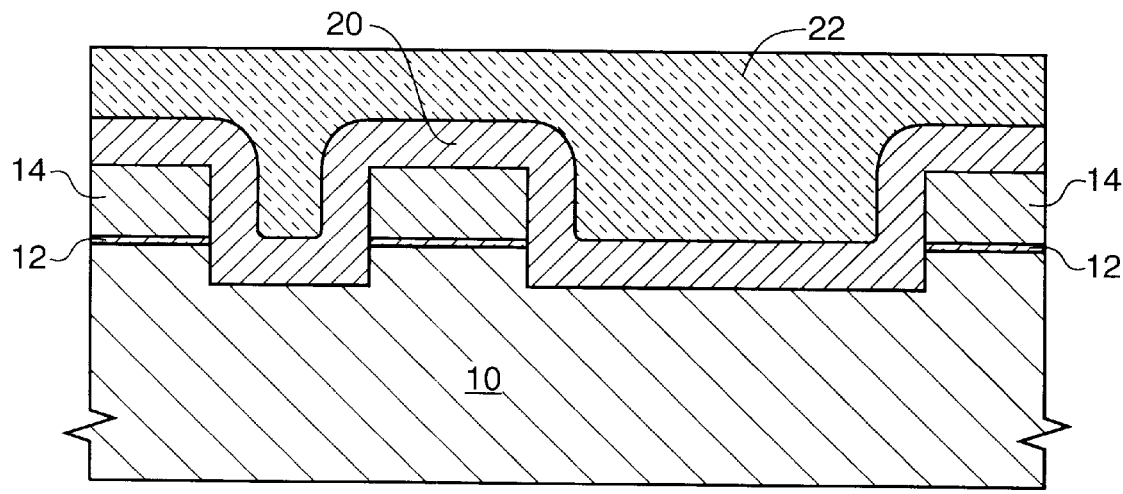
FIG. 2 is a cross section showing the FIG. 1 structure after an etch and layer formation.

Also shown in FIG. 1 is a patterned mask layer 16. An etch is performed to remove exposed portions of the nitride layer 14 and oxide layer 12 and etches a portion of the exposed substrate as shown in FIG. 2 to form a recess in the substrate. If a recess is formed, a semiconductor substrate is thus provided which has first and second surfaces with the second surface (the bottom of the trench) having an inferior plane with respect to the first surface (the unetched substrate). A recess of between about 200 angstroms (Å) and about 2000 Å would be sufficient, although other recess depths may be sufficient. It should be noted that etching the substrate is not required, and in an alternate embodiment of the invention the substrate is not etched.

Next, as shown in FIG. 2, a blanket layer of material 20 is formed over the substrate and directly on the substrate at the recesses. The material used for 20 is a material capable of forming an insulator, for example by oxidizing the material. Doped or undoped polycrystalline silicon (poly) or amorphous silicon would function sufficiently. For purposes of illustration only, poly is used to describe the embodiments in the following text, though other materials may function sufficiently.

A protective planar layer 22 such as tetraethyl orthosilicate (TEOS), borophosphosilicate glass (BPSG), spun-on glass (SOG), or photoresist is formed over poly 20. Any material which can be etched selective to material 20 would function sufficiently. Planarization of layer 22 can be performed by means such as mechanical, chemical, or chemical-mechanical planarization, by reflow, self-planarization during deposition, or by other workable means. In any case, the protective layer 22 is etched using a vertical etch to result in the structure of FIG. 3 wherein the protective layer 22 is formed over first portions of the poly 20 and second portions of the poly are left exposed. The exposed portions of the poly 20 are then removed, for example using an anisotropic or isotropic etch, to result in the structure of FIG. 4. In the case where a recess is formed, at least part of the poly is within the recess.

Figure 3:
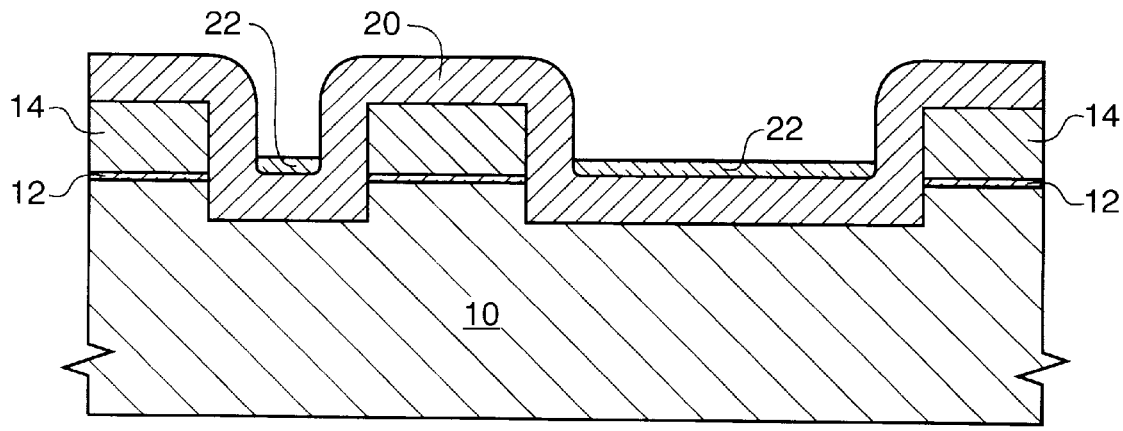
FIG. 3 is a cross section showing the FIG. 2 structure after various additional process steps.

The etching of protective layer 22 and poly 20 can be done in two etch steps, the first etch removing the protective layer 22 to the level shown in FIG. 3 and leaving poly 20 covering elements 14. The second etch, which can be an isotropic or anisotropic etch, removes poly 20 which is uncovered by protective layer 22. The protective layer 22 reduces the etching of poly 20.

In an alternate embodiment, the etching of protective layer 22 and poly 20 can also be performed in a single etch step if an etch is used which removes both layers 22 and 20. Nitride 14 can be etched along with the protective layer 22 and poly 20, as long as adequate nitride 14 remains after the etch to substantially prevent the underlying substrate from oxidizing during subsequent steps.

Figure 4:
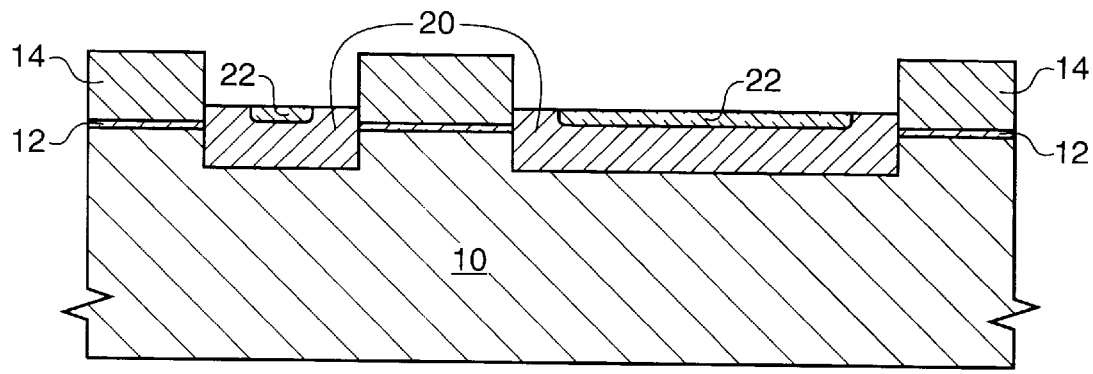
FIG. 4 is a cross section showing the FIG. 3 structure after an etch.
Figure 5:
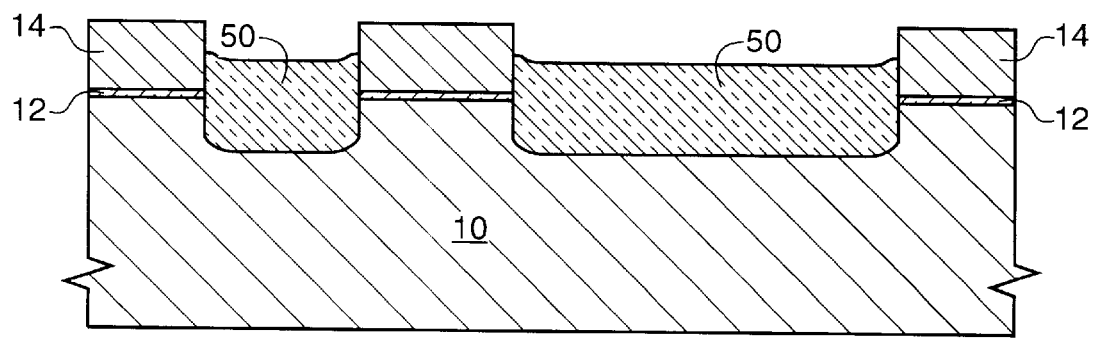
FIG. 5 is a cross section showing the FIG. 4 structure after forming an isolation region.

After layer 22 and material 20 are etched to form the structure of FIG. 4, the protective layer 22 is removed while the remaining poly 20 shown in FIG. 4 remains substantially intact. This results in a structure similar to FIG. 4 with layer 22 removed. Subsequently, an insulator such as oxide is formed from at least a portion of the remaining poly 20 to result in the structure of FIG. 5 which shows oxide 50, for example for use as field oxide. Wafer processing then continues, for example to form transistors.

With the inventive process the poly 20 of FIG. 4 oxidizes at a faster rate than the silicon substrate, usually at least twice as fast. A large percentage of the field oxide 50 is formed by oxidizing poly 20. As the poly is consumed by the oxidation process the oxidation begins to slow and the oxide formation is thereby somewhat self-limiting. The inventive process can result in a more uniform oxide than is produced with conventional field oxide formation which suffers from the commonly observed field oxide thinning effect in tight pitch areas.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, various materials can be used for the layers described. It is therefore contemplated that the appended claims will cover any such modifications or embodiments as fall within the true scope of the invention.

What is claimed is:

1. A method for forming a semiconductor device comprising the following steps:
    forming a blanket layer of oxidizable material directly on a semiconductor substrate;
    forming a protective layer to cover a first portion of said oxidizable material and leaving a second portion of said oxidizable material exposed;
    removing said exposed second portion of said oxidizable material;
    subsequent to said step of removing said exposed second portion of said oxidizable material, removing said protective layer thereby exposing at least a portion of said covered first portion of said oxidizable material; and
    subsequent to said step of exposing at least a portion of said covered first portion of said oxidizable material, oxidizing said oxidizable material.

2. The method of claim 1, wherein said substrate is etched to form a recess therein prior to said step of forming said blanket layer of oxidizable material, wherein said first portion of said material is formed only within said recess.

3. The method of claim 2, wherein said protective layer functions as a mask during said step of removing said exposed second portion of said blanket layer of oxidizable material and said mask resides only in said recess.

4. The method of claim 1, wherein said semiconductor substrate is a semiconductor wafer, further comprising the step of oxidizing a portion of said wafer during said step of oxidizing said oxidizable layer.

5. The method of claim 1, wherein said oxide is field oxide.

6. The method of claim 1, wherein said covered and uncovered portions of said oxidizable material are formed over a substantially planar portion of a semiconductor substrate.

7. A method for forming a semiconductor device comprising the following steps:
    providing a semiconductor substrate assembly having first and second recesses therein wherein said first and second recesses have different widths;
    forming a blanket oxidizable material over said semiconductor substrate assembly and within said first and second recesses;
    forming a blanket protective material on said semiconductor substrate assembly, wherein said protective material has a generally planar upper surface;
    vertically etching said protective material to leave said protective material covering said oxidizable material only in said recesses;
    removing said blanket oxidizable material from said semiconductor substrate assembly and leaving at least a portion of said oxidizable material within said first and second recesses;
    removing said protective material from said oxidizable material in said recesses; and
    oxidizing said oxidizable material in said first and second recesses.

8. The method of claim 7, wherein said step of oxidizing said oxidizable material forms field oxide.

9. The method of claim 7, wherein said recesses are formed in a silicon wafer and said oxidizable material is formed directly on said silicon wafer.

10. The method of claim 7, wherein said patterned protective material resides only in said recesses and functions as a mask layer during said step of removing said blanket oxidizable material.

11. A method of forming a semiconductor device comprising the following steps:
    providing a semiconductor device substrate assembly comprising a major surface having a recess therein;
    forming a blanket oxidizable layer over said major surface and within said recess;
    forming a planar blanket protective layer over said oxidizable layer;
    etching said protective layer such that a portion of said protective layer remains only in said recess;
    subsequent to said step of etching said protective layer, etching said blanket oxidizable layer using said etched protective layer as a mask such that said oxidizable layer remains only in said recess;
    etching said protective layer; and
    oxidizing said oxidizable layer to form field oxide.

12. The method of claim 11, wherein said oxidizable layer is etched subsequent to etching said protective layer.

13. The method of claim 11, wherein said substrate assembly includes a semiconductor wafer wherein said recess is formed within said wafer and said blanket oxidizable layer directly contacts said wafer at said recess.

14. An in-process semiconductor device comprising:
- a semiconductor substrate assembly comprising a semiconductor wafer having a substantially planar surface and a recess therein;
- an oxidizable layer within said recess contacting said semiconductor wafer;
- a protective layer over said oxidizable layer within said recess wherein said protective layer is absent from over said planar surface.

15. The device of claim 14 wherein a portion of said oxidizable layer within said recess is free from any overlying protective layer.

16. The device of claim 14, wherein said oxidizable layer is absent from said planar surface.

17. The device of claim 14 wherein said substrate assembly is a semiconductor wafer and said nitride layer is formed directly on said oxidizable layer.

18. A method used during the formation of a semiconductor device comprising the following steps:
- providing a semiconductor wafer assembly comprising a semiconductor wafer having a trench therein;
- forming a conformal oxidizable layer over said wafer assembly and within said trench, wherein said oxidizable layer forms a recess conformal with said trench;
- providing a generally planar blanket protective layer over said wafer assembly;
- vertically etching said blanket protective layer such that said protective layer remains only in said recess in said oxidizable layer;
- etching said oxidizable layer using said protective layer as a mask; and
- subsequent to etching said oxidizable layer, oxidizing said oxidizable layer.

19. The method of claim 18 wherein said steps of vertically etching said blanket layer and etching said oxidizable layer are performed during a single etch step.

20. The method of claim 18 wherein said step of providing said oxidizable layer provides an oxidizable layer which contacts said semiconductor wafer within said trench.

* * * * *